(12) United States Patent
Martin et al.

(10) Patent No.: US 7,813,194 B2
(45) Date of Patent: *Oct. 12, 2010

(54) APPARATUS AND METHOD FOR REPAIRING A SEMICONDUCTOR MEMORY

(75) Inventors: Chris G. Martin, Boise, ID (US); Troy A. Manning, Meridian, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/372,331

(22) Filed: Feb. 17, 2009

(65) Prior Publication Data

US 2009/0147600 A1    Jun. 11, 2009

Related U.S. Application Data

(63) Continuation of application No. 11/876,477, filed on Oct. 22, 2007, now Pat. No. 7,492,652, which is a continuation of application No. 11/714,979, filed on Mar. 7, 2007, now Pat. No. 7,408,825, which is a continuation of application No. 11/170,260, filed on Jun. 29, 2005, now Pat. No. 7,215,586.

(51) Int. Cl.
*G11C 29/00* (2006.01)
*G11C 7/06* (2006.01)
(52) U.S. Cl. .................. 365/200; 365/189.07
(58) Field of Classification Search .................. 365/200
See application file for complete search history.

(56) References Cited

U.S. PATENT DOCUMENTS

| 4,459,685 | A | 7/1984 | Sud et al. |
| 4,598,388 | A | 7/1986 | Anderson |
| 4,601,019 | A | 7/1986 | Shah et al. |
| 5,031,151 | A | 7/1991 | Fifield et al. |
| 5,257,229 | A | 10/1993 | McClure et al. |

(Continued)

FOREIGN PATENT DOCUMENTS

DE    102004016323    10/2004

(Continued)

OTHER PUBLICATIONS

International Search Report for International Application No. PCT/US2006/023219 dated Nov. 17, 2006 (4 pages).

*Primary Examiner*—Son L Mai
(74) *Attorney, Agent, or Firm*—TraskBritt (57) ABSTRACT

An apparatus and method for repairing a semiconductor memory device includes a first memory cell array, a first redundant cell array and a repair circuit configured to nonvolatilely store a first address designating at least one defective memory cell in the first memory cell array. A first volatile cache stores a first cached address corresponding to the first address designating the at least one defective memory cell. The repair circuit distributes the first address designating the at least one defective memory cell of the first memory cell array to the first volatile cache. Match circuitry substitutes at least one redundant memory cell from the first redundant cell array for the at least one defective memory cell in the first memory cell array when a first memory access corresponds to the first cached address.

16 Claims, 7 Drawing Sheets

U.S. PATENT DOCUMENTS

| | | | |
|---|---|---|---|
| 5,268,866 A | 12/1993 | Feng et al. |
| 5,270,976 A | 12/1993 | Tran |
| 5,287,310 A | 2/1994 | Schreck et al. |
| 5,355,340 A | 10/1994 | Coker et al. |
| 5,396,124 A | 3/1995 | Sawada et al. |
| 5,422,850 A | 6/1995 | Sukegawa et al. |
| 5,471,426 A | 11/1995 | McClure |
| 5,502,674 A | 3/1996 | Griffus et al. |
| 5,511,028 A | 4/1996 | Nam |
| 5,544,106 A | 8/1996 | Koike |
| 5,572,470 A | 11/1996 | McClure et al. |
| 5,572,471 A | 11/1996 | Proebsting |
| 5,583,463 A | 12/1996 | Merritt |
| 5,729,551 A | 3/1998 | Park et al. |
| 5,831,923 A | 11/1998 | Casper |
| 5,886,940 A | 3/1999 | Morzano et al. |
| 5,952,845 A | 9/1999 | Merritt |
| 5,978,297 A | 11/1999 | Ingalls |
| 5,999,480 A | 12/1999 | Ong et al. |
| 6,005,813 A | 12/1999 | Waller et al. |
| 6,064,617 A | 5/2000 | Ingalls |
| 6,125,067 A | 9/2000 | Waller et al. |
| 6,163,490 A | 12/2000 | Shaffer et al. |
| 6,199,177 B1 | 3/2001 | Blodgett |
| 6,301,164 B1 | 10/2001 | Manning et al. |
| 6,351,425 B1 | 2/2002 | Porter |
| 6,366,118 B2 | 4/2002 | Oh et al. |
| 6,480,429 B2 | 11/2002 | Jones et al. |
| 6,490,207 B2 | 12/2002 | Manning |
| 6,553,556 B1 | 4/2003 | Blodgett |
| 6,621,751 B1 | 9/2003 | Abedifard et al. |
| 6,633,506 B2 | 10/2003 | Casper et al. |
| 6,724,670 B2 | 4/2004 | Jones et al. |
| 6,750,700 B2 | 6/2004 | Keeth et al. |
| 6,778,459 B2 | 8/2004 | Blodgett |
| 6,829,176 B2 | 12/2004 | Callaway et al. |
| 6,839,292 B2 | 1/2005 | Gatzemeier et al. |
| 6,845,043 B2 | 1/2005 | Dono |
| 6,937,533 B2 | 8/2005 | Hojo et al. |
| 6,967,878 B2 | 11/2005 | Dono |
| 7,035,152 B1 | 4/2006 | Bae et al. |
| 7,120,068 B2 | 10/2006 | Lakhani et al. |
| 7,190,629 B2 | 3/2007 | Pan et al. |
| 7,215,586 B2 | 5/2007 | Martin et al. |
| 7,408,825 B2 | 8/2008 | Martin et al. |
| 7,492,652 B2 * | 2/2009 | Martin et al. ............ 365/200 |
| 2002/0075733 A1 | 6/2002 | Zheng et al. |
| 2003/0026136 A1 | 2/2003 | Maejima |

FOREIGN PATENT DOCUMENTS

WO        0141150        6/2001

* cited by examiner

APPARATUS AND METHOD FOR REPAIRING A SEMICONDUCTOR MEMORY

CROSS-REFERENCE TO RELATED APPLICATIONS

This application is a continuation of application Ser. No. 11/876,477, filed Oct. 22, 2007, now U.S. Pat. No. 7,492,652, issued Feb. 17, 2009, which is a continuation of application Ser. No. 11/714,979, filed Mar. 7, 2007, now U.S. Pat. No. 7,408,825, issued Aug. 5, 2008, which is a continuation of application Ser. No. 11/170,260, filed Jun. 29, 2005, now U.S. Pat. No. 7,215,586, issued May 8, 2007.

BACKGROUND OF THE INVENTION

Field of the Invention

The present invention relates generally to semiconductor memories and, more specifically, to dynamically detecting and repairing faults in semiconductor memories by testing memory blocks and remapping failed memory blocks with unassigned spare memory blocks.

Semiconductor memories generally include a multitude of memory cells arranged in rows and columns. Each memory cell is structured for storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in predecoded form) on a chip on which the semiconductor memory is fabricated by programming a nonvolatile element (e.g., a group of fuses, antifuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in predecoded form) on the chip by programming a nonvolatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

The process described above for repairing a semiconductor memory using redundant rows and columns is well known in the art, and is described in various forms in U.S. Pat. Nos. 4,459,685; 4,598,388; 4,601,019; 5,031,151; 5,257,229; 5,268,866; 5,270,976; 5,287,310; 5,355,340; 5,396,124; 5,422,850; 5,471,426; 5,502,674; 5,511,028; 5,544,106; 5,572,470; 5,572,471; 5,583,463 and 6,199,177. U.S. Pat. Nos. 6,125,067 and 6,005,813 disclose repairing a semiconductor memory using redundant subarrays.

One problem that arises with repairing semiconductor memories utilizing redundant memory elements such as rows, columns, subrows and subcolumns is that such repair is typically done at some point in the fabrication and test process. This is typically done by remapping the redundant spare memory elements to replace failed memory elements by programming nonvolatile elements (e.g., groups of fuses, antifuses, or FLASH memory cells).

In order to program these nonvolatile elements, higher than normal (e.g., operating) voltages are typically required. Thus, a relatively high voltage may be selectively applied to "blow" fuses or antifuses, or program FLASH memory cells. This relatively high voltage typically requires the nonvolatile elements be placed at a safe distance from sensitive devices that could be permanently damaged by such extreme voltages and/or currents. Generally, these nonvolatile elements are not formed using minimum feature dimensions and therefore, do not lend themselves to reductions in dimensions as are exhibited on successive generation memory cells. As memory cell access times increase, the propagation time of addresses and data values for comparison becomes critical. Therefore, it would be desirable to provide a method and system for making the nonvolatilely stored memory repair information more expeditiously available to memory addressing circuitry in order to reduce memory access times of redundant memory repair blocks.

BRIEF SUMMARY OF THE INVENTION

An apparatus and method for repairing a semiconductor memory is provided. In one embodiment of the present invention, a method of repairing a sequence of memory cells on a memory device includes nonvolatilely programming on a memory device a group of programmable elements to store a first address designating at least one defective memory cell in a first array of memory cells. The first address designating the at least one defective memory cell is volatilely stored as a first cached address. At least one redundant memory cell is substituted for the at least one defective memory cell when a first memory access corresponds to the first cached address.

In another embodiment of the present invention, a memory device repair circuit is provided. The repair circuit includes a plurality of antifuses and programming logic configured to nonvolatilely program the plurality of antifuses in response to program data corresponding to repairing a sequence of memory cells on a memory device. The repair circuit further includes first antifuse logic configured to nonvolatilely store a first address designating at least one defective memory cell in a first array of memory cells, wherein the first antifuse logic is further configured to distribute the first address designating the at least one defective memory cell to a first volatile cache on the memory device.

In yet another embodiment of the present invention, a memory device is provided. The memory device includes a first memory cell array and a first redundant cell array. A repair circuit is configured to nonvolatilely store a first address designating at least one defective memory cell in the first memory cell array. A first volatile cache is configured to store a first cached address corresponding to the first address designating the at least one defective memory cell. The repair circuit is further configured to distribute the first address designating the at least one defective memory cell of the first memory cell array to the first volatile cache on the memory device. The memory device further includes a match circuit configured to substitute at least one redundant memory cell from the first redundant cell array for the at least one defective memory cell in the first memory cell array when a first memory access corresponds to the first cached address.

In a further embodiment of the present invention, a semiconductor substrate having a memory device fabricated thereon is provided. The semiconductor substrate includes a memory device comprising a first memory cell array, a first redundant cell array and a repair circuit configured to nonvolatilely store a first address designating at least one defective memory cell in the first memory cell array. A first volatile cache stores a first cached address corresponding to the first address designating the at least one defective memory cell and the repair circuit distributes the first address designating the at least one defective memory cell of the first memory cell array to the first volatile cache on the memory device. A match circuit substitutes at least one redundant memory cell from the first redundant cell array for the at least one defective memory cell in the first memory cell array when a first memory access corresponds to the first cached address.

In a yet further embodiment of the present invention, an electronic system is provided. The electronic system includes an input device, an output device, a memory device, and a processor device coupled to the input, output, and memory devices, wherein at least one of the input, output, memory, and processor devices includes a memory device.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Figure 1:
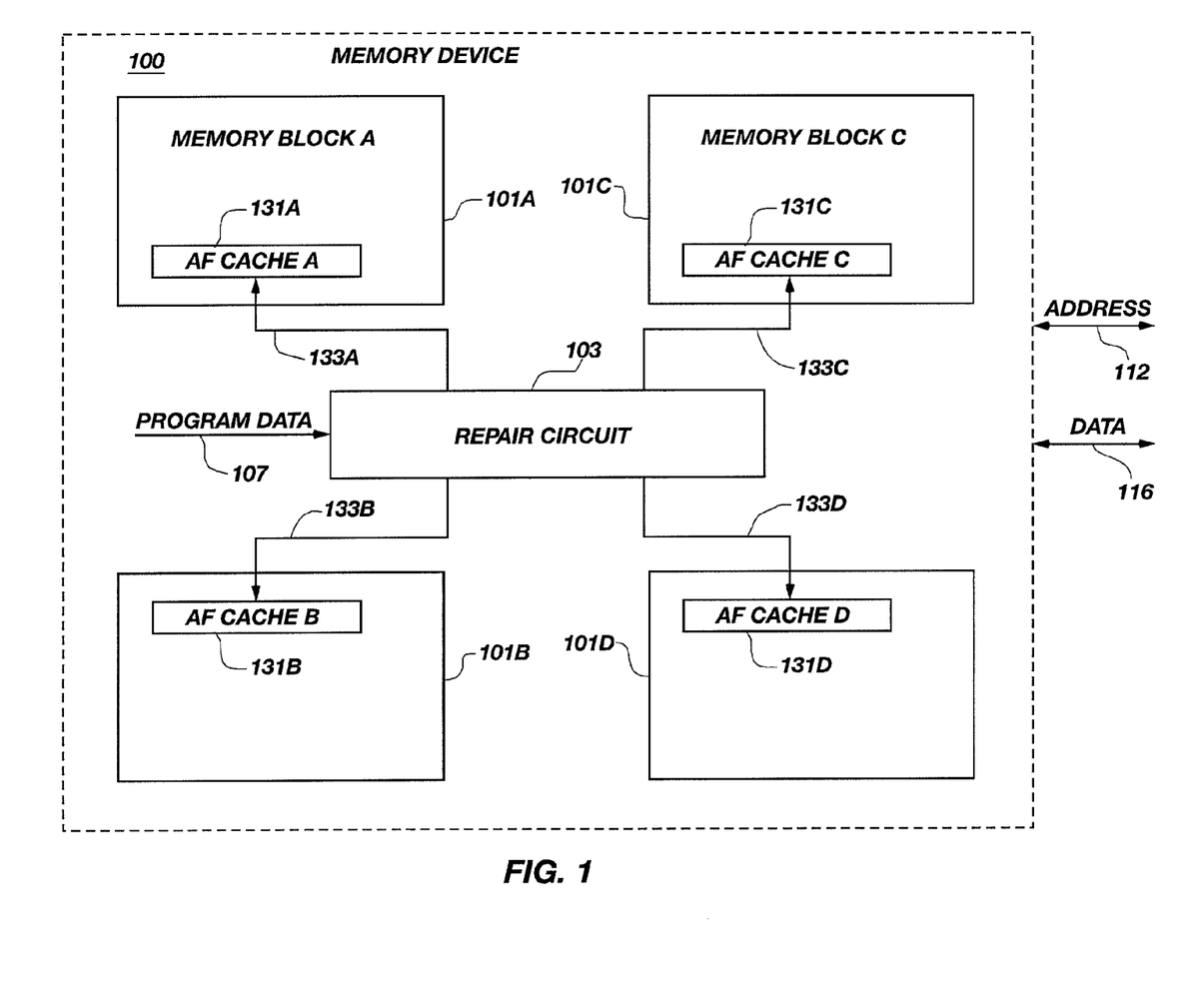
FIG. 1 is a block diagram of a memory device, in accordance with an embodiment of the present invention.
Figure 2:
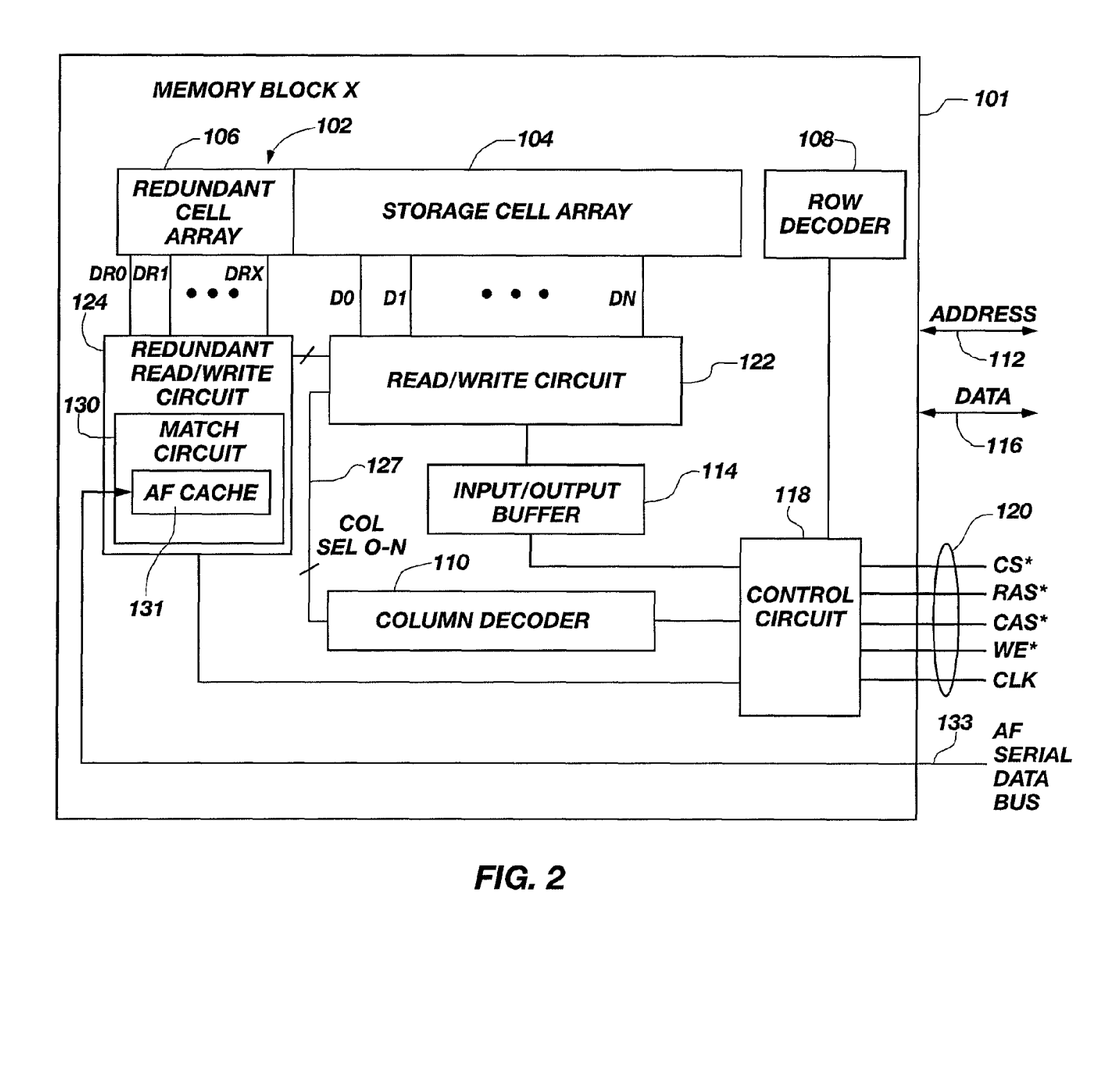
FIG. 2 is a block diagram of a memory block of a memory device, in accordance with an embodiment of the present invention.
Figure 3:
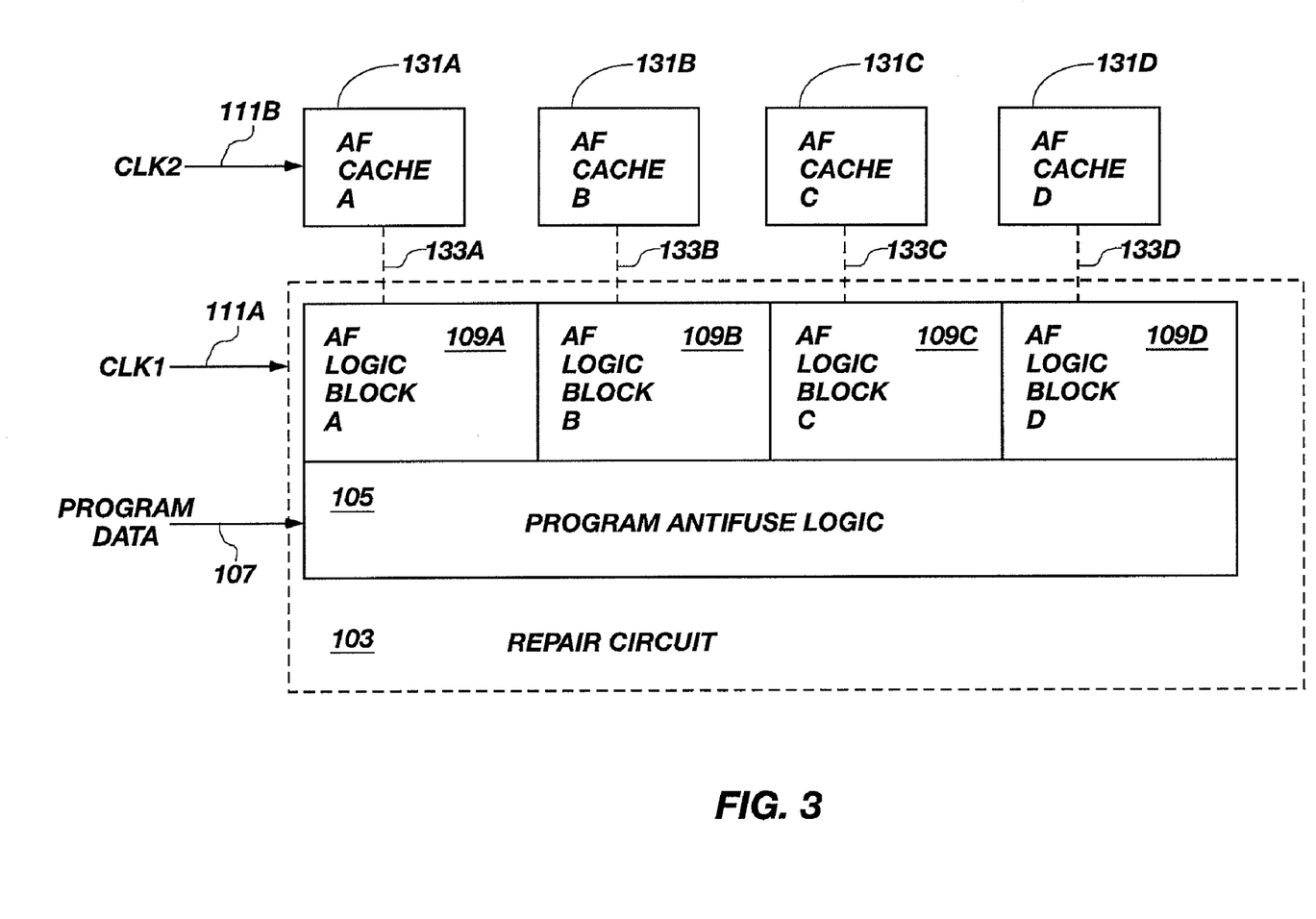
FIG. 3 is a block diagram of a repair logic circuit, in accordance with an embodiment of the present invention.

FIG. 1 is a block diagram of a memory device, in accordance with an embodiment of the present invention. Various aspects of a memory device 100 are similar to a conventional memory device and, as such, conventional elements have not been shown in order to avoid obscuring the present invention. The memory device 100 includes memory blocks 101 which each include a memory array (FIG. 2) and a redundant cell array (FIG. 2) employed to replace defective memory cells in the memory array. Remapping of defective memory cells to the redundant memory arrays is accomplished in repair circuit 103 by programming a programmable device, such as an antifuse (FIG. 3).

In one embodiment of the present invention, the memory device 100 includes centralized repair circuit 103 configured to receive program data 107 as determined in a previously administered testing process for determining defective memory cells within the memory array. The specifics of a testing process for determining defective memory cells is known by those of ordinary skill in the art and is not further discussed herein. The repair circuit 103 includes stored or programmed information identifying the locations of the defective memory cells for each of the memory arrays within the memory device 100. The antifuses within repair circuit 103 can be grouped to uniquely identify respective memory blocks.

In an exemplary embodiment of the present invention, the memory device 100 includes storage capacity that is partitioned into separate regions or memory blocks 101. While the present illustration exhibits four separate memory blocks, 101A-101D, such a quantity is merely illustrative and is not to be considered as limiting of the scope of the present invention. Consistent with the partitioning of the memory blocks 101 within memory device 100, each of the memory blocks 101A-101D includes an antifuse cache 131, exemplarity illustrated as respective antifuse caches 131A-131D.

While the repair circuit 103 is a programmable device and maintains the nonvolatile programmed identification of defective memory devices for each of the memory blocks 101A-101D of the memory device 100, the memory block-specific defective memory cell remapping information is sent via respective serial data buses 133A-133D to the respective memory blocks 101A-101D for local volatile caching.

Memory device 100 includes, by way of example and not limitation, a synchronous dynamic random access memory device (SDRAM). The memory device of FIG. 1 includes one or more memory blocks 101, as detailed with respect to FIG. 2. FIG. 2 is a block diagram of one embodiment of a memory block 101 according to the invention. As shown in FIG. 2, memory block 101 includes a memory array 102. Memory array 102 typically includes dynamic random access memory (DRAM) devices, which may be further segmented into one or more memory banks. Each memory array 102 includes memory cells arranged in rows and columns in the form of a plurality of storage cells, illustrated as storage cell array 104, and one or more redundant cells, illustrated herein as redundant cell array 106. A row decoder 108 and a column decoder 110 access the rows and columns of memory array 102 in response to an address provided on address bus 112 (ADDRESS). An input/output buffer 114 is connected to a data bus 116 (DATA) for bi-directional data communication with memory array 102. A memory control circuit 118 controls data communication between the memory block 101 and external devices by responding to an input clock signal (CLK) and control signals provided on control lines 120 (CONTROL). The control signals include, but are not limited to, Chip Select (CS*), Row Access Strobe (RAS*), Column Access Strobe (CAS*), and Write Enable (WE*).

Memory block 101 further includes a read/write circuit 122 connected to the storage cells via a plurality of digit lines D0-DN and connected to column decoder 110 via column select lines 127. Read/write circuit 122 is also connected to input/output buffer 114 through read and write registers (not shown). A redundant read/write circuit 124 is provided which is connected to the redundant cells via a plurality of paired redundant digit lines DR0-DRX.

In addition, memory block 101 includes a redundancy address match circuit 130 which receives the present address from the address bus 112 and compares the address against addresses which are known, through previous testing of the memory array, to contain defective memory cells. The information identifying the addresses of defective memory cells is locally stored or cached in antifuse cache 131 within the memory block 101. When a match between the present address and values stored within antifuse cache 131 occurs, the match circuit 130 generates a match signal indicating a bad bit within a column of the storage cells in the present address. While the present illustration identifies a defective memory cell in a column and a redundant replacement, the interchangeability of rows for columns and columns for rows is understood by those of ordinary skill in the art and such interchangeability is contemplated to be within the scope of the present invention.

In a read operation, control circuit 118 decodes a combination of control signals on line 120 and present address on address bus 112 to initiate the read operation. One of column select lines 127 activates a certain column select (Col Sel X) in response to address bus 112 to access a column of storage cells in storage cell array 104. Accessed data or bits of the storage cells are transmitted to read/write circuit 122 via digit lines D0-DN. At the same time, control circuit 118 activates the redundancy address match circuit 130 to compare the present column address with programmed column addresses having bad storage cells as identified in antifuse cache 131. If there is no match between the present column address and the programmed column addresses stored in antifuse cache 131, the data of storage cells are output to a data read register (not shown) and subsequently to input/output buffer 114 and data bus 116.

However, a match identified in the match circuit 130 between the present column address indicates that the column being accessed has a bad bit. In this case, redundancy address match circuit 130 activates a redundant column select signal and connects redundant cells from redundant cell array 106 through one of the redundant digit lines DR0-DRX to redundant read/write circuit 124 and then to read/write circuit 122 for substitution of the defective memory cells from the storage cell array 104. The data from the nondefective memory cells of storage cell array 104 and the replacement or redundant memory cells from redundant cell array 106 are output to a data read register (not shown) and subsequently to input/output buffer 114 and data bus 116.

In a write operation, data is written into storage cells or redundant cells in an opposite path. Data or bits at data bus 116 are transmitted to input/output buffer 114 and then to a data write register (not shown). From the data write register, the data are transmitted to read/write circuit 122. If there is no match between the present column address and the programmed addresses stored in antifuse cache 131, then the data are transmitted to digit lines D0-DN and into storage cell array 104.

However, a match identified in the match circuit 130 between the present column address indicates that the column being accessed has a bad bit. In this case, redundancy address match circuit 130 activates a redundant column select signal and connects redundant cells from redundant cell array 106 through one of the redundant digit lines DR0-DRX to redundant read/write circuit 124 and then to read/write circuit 122 for substitution of the defective memory cells from the storage cell array 104. The bit (or bits) is subsequently written into one of the redundant cells or redundant cell array 106.

FIG. 3 illustrates a defective memory cell repair circuit and methodology, in accordance with an embodiment of the present invention. The various embodiments of the present invention are drawn to repairing defective memory arrays through the use of redundant memory cells. The repair methodology repairs a sequence of memory cells of a memory device by testing the various memory arrays of the memory device and identifying defective memory cells. The memory device includes nonvolatilely programmable elements capable of storing addresses or other designators which may be used to identify the addresses of defective memory cells. In one embodiment, the programmable elements are configured as antifuses, the specific fabrication and function of which are known by those of ordinary skill in the art.

The repair methodology utilizes a repair circuit 103 for receiving, retaining and making available to the various memory blocks information identifying defective memory cells. In one embodiment of the present invention, the repair circuit 103 is collectively and may be even centrally located. It is well known that technological advances enable a reduction in memory cell dimensions and in the dimensions of essential supporting circuitry (e.g., sense amplifiers) as well as a reduction in the operating voltages and currents. Additionally, technological advances enable reduction in dimensions of the various elements of a memory block. However, it is also well known that the programming of programmable elements, such as antifuses, requires the use of larger voltages and/or currents to effectively alter storage elements causing the storage elements to retain a programmed state. While the programmable elements may also technologically evolve to smaller dimensions requiring reduced voltages and/or current, placement of higher potentials in close proximity to sensitive memory block components is undesirable.

Referring to FIG. 3, the repair circuit 103 includes one or more antifuse logic blocks 109 which each contain one or more programmable elements described herein as antifuses. In order to program the programmable elements, program antifuse logic 105 receives program data 107 identifying the addresses of the defective memory cells. Program antifuse logic 105 is coupled to the antifuse logic blocks 109 and programs the defective memory cell addresses into the respective programmable elements. Program antifuse logic 105 may be configured as a serial-load, parallel-output register that couples to each of the respective antifuse logic blocks 109.

The defective memory cell repair methodology of the present invention further includes distribution or transmission of the antifuse data of each of the antifuse logic blocks to the respective memory blocks and corresponding memory arrays to which the data applies. Accordingly, each antifuse logic block 109 couples to respective antifuse caches 131 by way of a serial data bus 133 with the respective antifuse data being, on one embodiment, synchronously transferred according to CLK1 111A and/or CLK2 111B. According to the exemplary illustration of FIG. 3, an exemplary quantity of four antifuse logic blocks 109A-109D are illustrated as coupling via respective serial data buses 133A-133D to antifuse caches 131A-131D.

It is appreciated that a great incentive exists to efficiently utilize the available area on a memory device. Accordingly, one embodiment of the present invention implements serial data buses 133 as serial distribution lines with the antifuse data stored in each of the antifuse logic blocks being converted from a parallel storage format into a serial output format. Distribution of the antifuse data nonvolatilely resident in the repair circuit 103 may be distributed to the respective volatile antifuse caches 131 during a startup phase of the memory device, such as following power up of the memory device.

Figure 4:
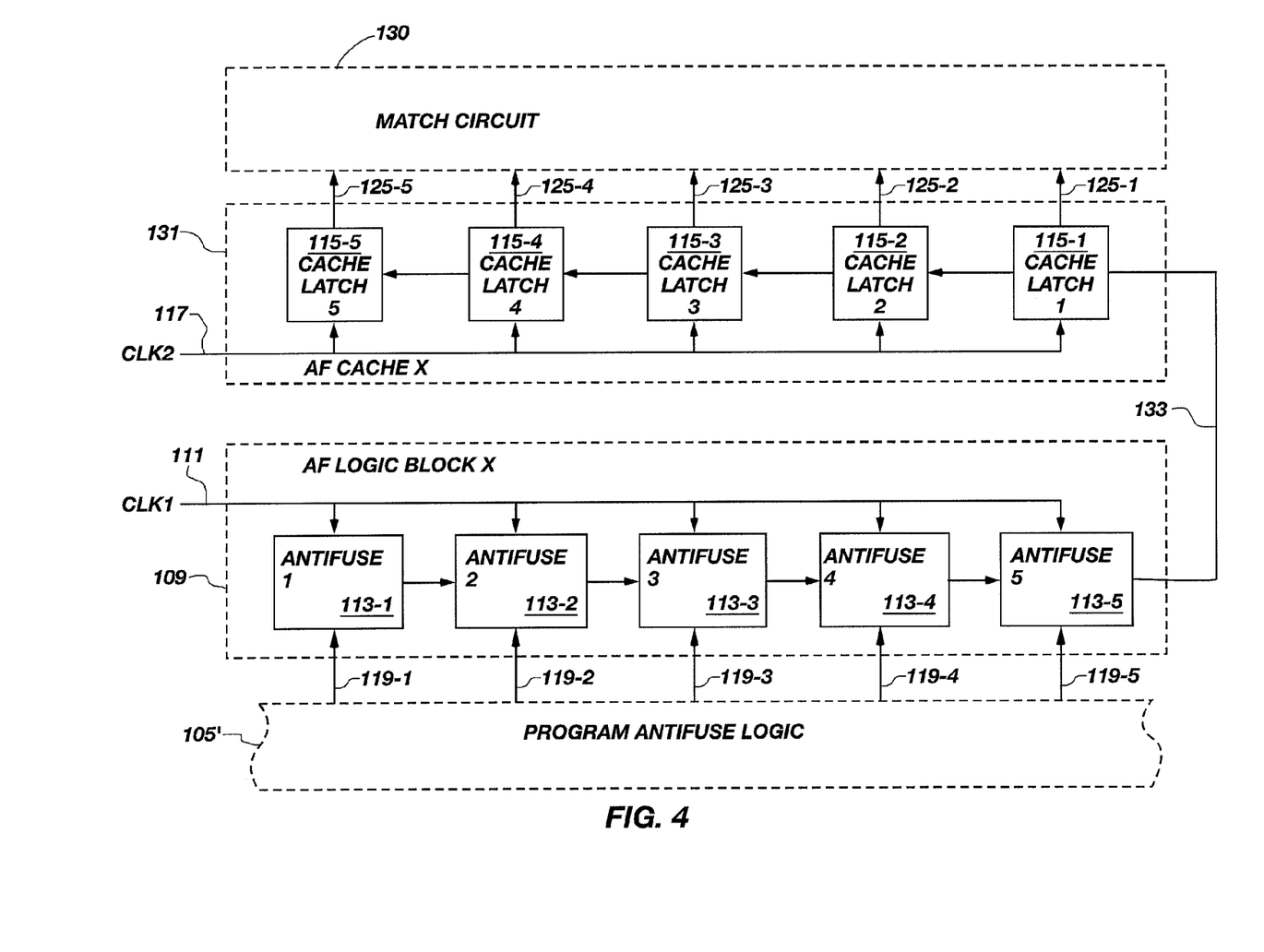
FIG. 4 is a block diagram of an antifuse logic block and a remote antifuse cache, in accordance with an embodiment of the present invention.

FIG. 4 illustrates a block diagram of the antifuse logic block and the antifuse cache, in accordance with an embodiment of the present invention. Each of the antifuse logic blocks 109 is nonvolatilely programmed via a program interface 119-1 through 119-X of at least a portion 105' of the program antifuse logic 105 (FIG. 3). Those of skill in the art appreciate that programming of programmable elements such as antifuses, utilizes much larger voltages and/or currents than are utilized during the conventional data storage and retrieval function of the memory device.

Accordingly, the antifuses 113-1 through 113-X may be generally arranged in a location that minimizes and prevents the deleterious effects from larger voltages and/or larger currents upon the conventional memory elements of a memory device. Therefore, the antifuse block logic block 109 of the present invention includes antifuses 113 that are configured with circuitry and logic for nonvolatilely storing and retrieving from a storage element the respective logic states. The antifuses 113 are further configured to retrieve the logic states and convey them according to a parallel-to-serial transmission methodology. Specifically, a CLK1 111 synchronously clocks each of the antifuses 113-1 through 113-N until each of the logic states stored in antifuse logic block 109 are serially transferred across the serial data bus 133 from the antifuse logic block 109 to the respective antifuse cache 131.

The antifuse cache 131 is configured to provide local caching of the stored values in a location that is generally adjacent and accessible to match circuit 130 of each of the memory arrays. Since the antifuse cache 131 does not need to accommodate high antifuse programming voltages and/or currents, the antifuse cache 131 may be implemented as memory storage elements that are fabricated with area dimensions similar to those of the surrounding memory block 101 components. Additionally, since antifuse cache 131 includes circuit and logic elements of feature sizes and dimensions of the surrounding memory block circuitry, the antifuse cache 131 may also undergo process feature size reductions and integration with the related memory cell arrays.

Antifuse cache 131, of the present invention, may be configured to include a series of storage elements arranged as cache latch_1 through cache latch_N. In the specific illustration of FIG. 4, an arbitrary quantity, 5, of latches_X is shown and corresponds to a respective quantity of antifuses 113. Such an illustrated quantity is not to be considered as limiting. Continuing with respect to FIG. 4, cache latch 115-1 through cache latch 115-5 are configured to be serially loaded with antifuse data received over serial data buses 133 from the nonvolatile antifuse logic block 109. In one embodiment, the antifuse data is serially loaded by a CLK2 117 which sequences the antifuse data through to the respective latches. Once the antifuse data is cached in the respective cache latches 115 of the antifuse cache 131, the data is available to match circuit 130 for address comparison over cache latch outputs 125-1 through 125-5.

Figure 5:
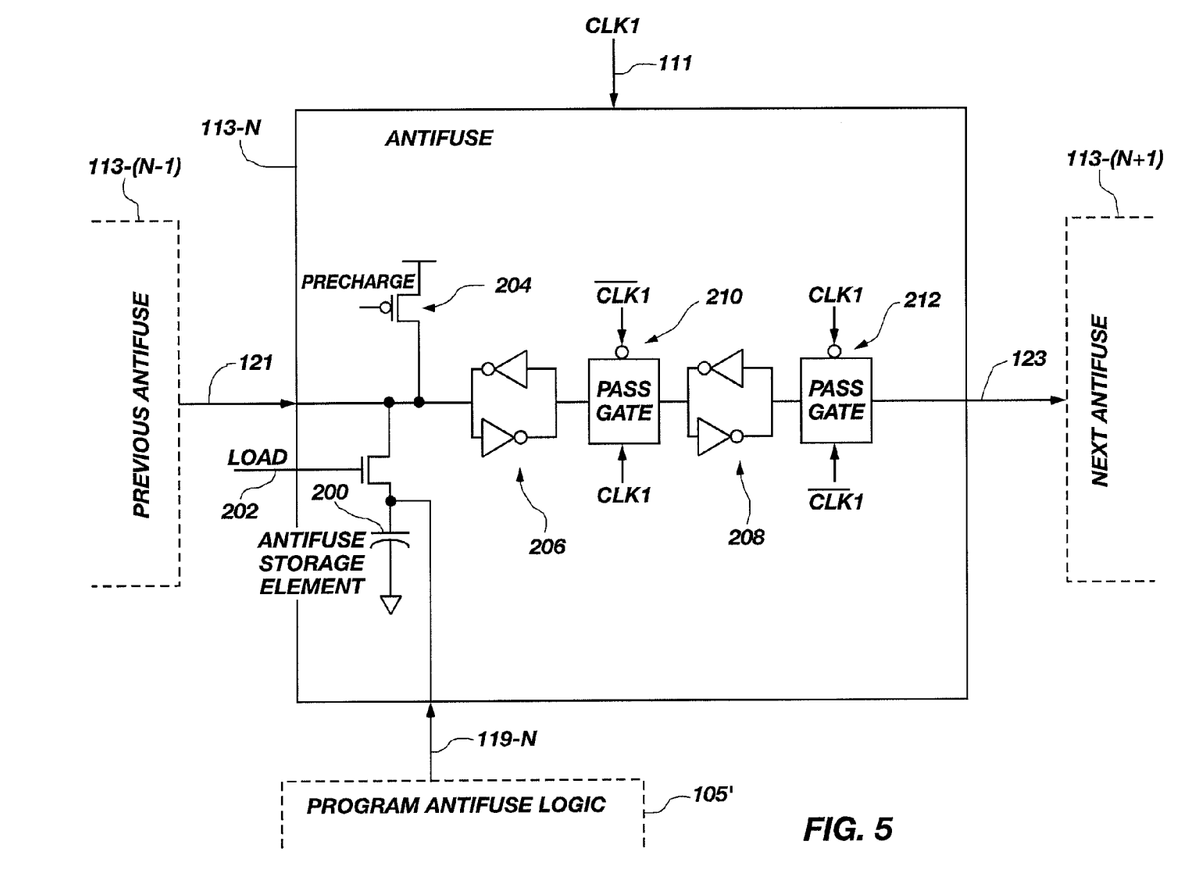
FIG. 5 is a circuit diagram of antifuse logic configured in accordance with an embodiment of the present invention.

FIG. 5 illustrates an antifuse, in accordance with an embodiment of the present invention. As stated, an antifuse 113 is configured to be programmed to nonvolatilely retain a programmed state of a portion of an address corresponding to a detected defective memory cell. Additionally, antifuse 113 is further configured to load the stored logic state onto a serial bus and to serially transfer other stages of the data through the antifuse 113 along the serial bus. Specifically, antifuse 113 includes an antifuse storage element 200 which is nonvolatilely programmed through a program signal 119 from program antifuse logic portion 105'. By way of example and not limitation, antifuse storage element 200 is illustrated as an antifuse capacitor but may be configured as any number of programmable devices as known by those of ordinary skill in the art.

Once nonvolatilely programmed, a load signal 202, upon, for example, a memory device power-up state, switches the impedance of antifuse storage element 200 onto the serial signal line 121 which, in one embodiment, is pulled up by a precharge device 204. The resultant logic level of the serial signal line 121 is input to a first latch 206 and clocked by CLK1 111 to a second latch 208 by a first pass gate 210. Once the logic value of antifuse storage element 200 is "trapped" between the first pass gate 210 and a second pass gate 212, the load signal 202 disconnects the impedance of the antifuse storage element 200 from the serial signal line 121 to accommodate the serial propagation of the logic level of a previous antifuse (N−1) 113 on another phase of the CLK1 111 through first latch 206. The subsequent phase of CLK1 111 also advances the logic level retained at second latch 208 to pass on line 123 to a subsequent antifuse (N+1) 113. The CLK1 111 cycles the number of times necessary for sequencing each of the antifuse data through the antifuse logic block 109 (FIG. 4).

Figure 6:
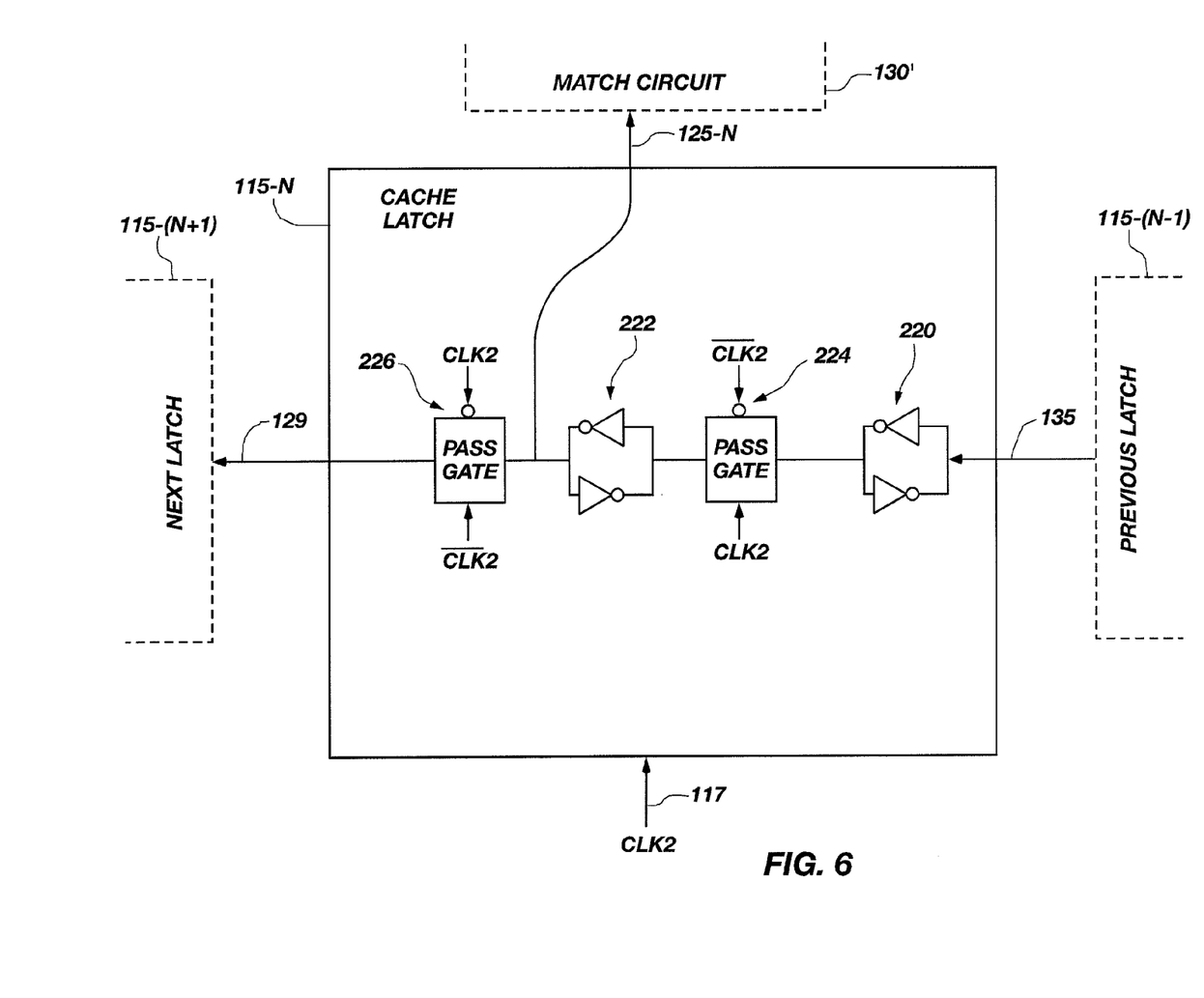
FIG. 6 is a circuit diagram of a cache latch for a remote antifuse cache, in accordance with an embodiment of the present invention.

FIG. 6 illustrates a cache latch, in accordance with an embodiment of the present invention. As stated, a cache latch 115 is configured to volatilely retain a programming state of a portion of an address corresponding to a detected defective memory cell. Additionally, cache latch 115 is further configured to receive the stored logic state from a serial bus and to serially transfer the antifuse data through the cache latch 115 along successive serial stages of cache latches.

Specifically, cache latch 115 includes a first latch 220 for receiving antifuse data from a serial signal line 135. The resultant logic level of the serial signal line 135 is input to a first latch 220 and clocked by CLK2 117 to a second latch 222 by a first pass gate 224. Once the logic level of the antifuse data is "trapped" between first pass gate 224 and a second pass gate 226, the logic level is either retained and output as antifuse cache data on cache latch output 125 or if the entire serial sequence of antifuse data has not been completely loaded into the antifuse cache 131 (FIG. 4), then the logic level is forwarded on line 129 on a subsequent phase of CLK2 117 to a subsequent one of cache latch (N+1) 115. The CLK2 117 cycles the number of times necessary for sequencing each of the antifuse data through the antifuse cache 131 (FIG. 4).

Once the entire sequence of antifuse data is loaded into the cache latches 115-1 through 115-5 of antifuse cache 131, the clocking stops and the antifuse data is available to the match circuit 130' over the cache latch outputs 125-1 through 125-5.

Figure 7:
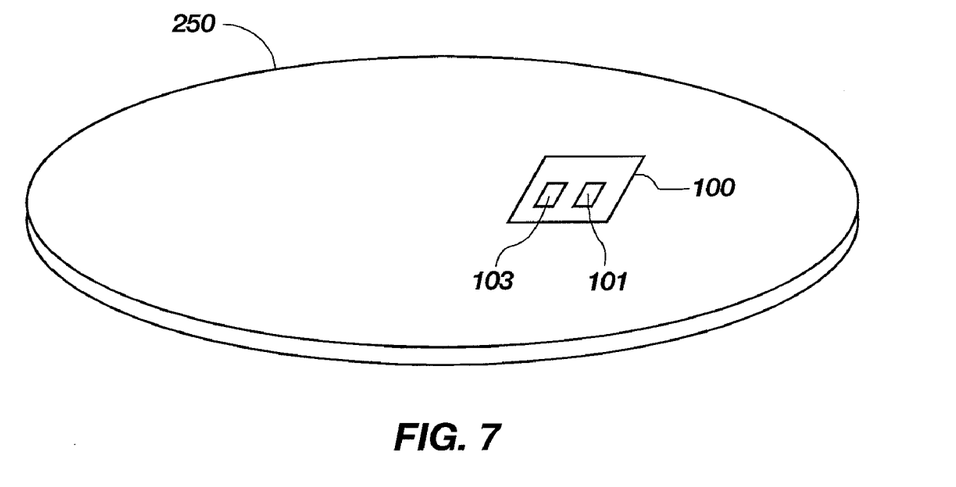
FIG. 7 illustrates a semiconductor wafer including a memory device configured in accordance with an embodiment of the present invention.

As shown in FIG. 7, the memory device 100 as described above is fabricated on a semiconductor wafer 250. It should be understood that the memory device 100 may also be fabricated on a wide variety of other semiconductor substrates. Memory device 100 further includes at least one memory block 101 and repair circuit 103 as described herein above.

Figure 8:
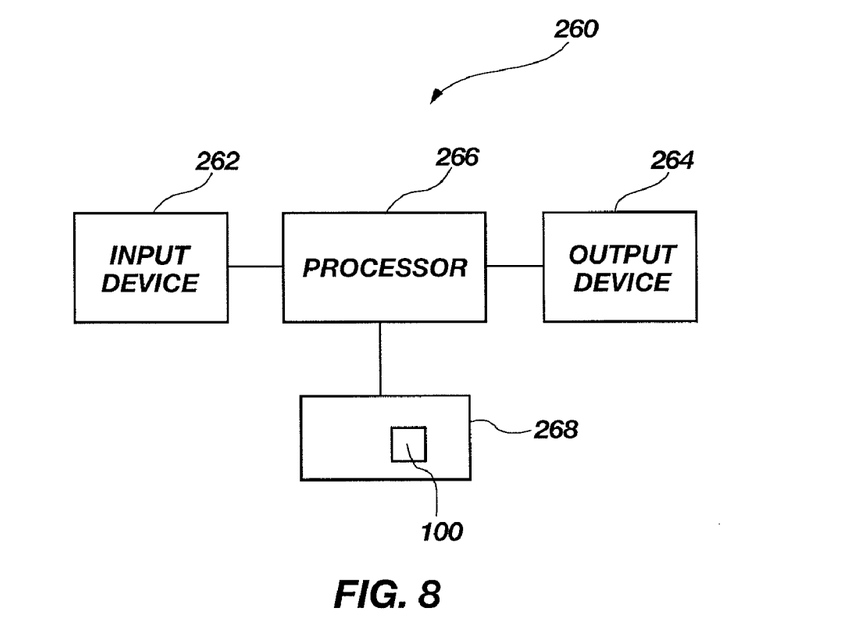
FIG. 8 is a block diagram of an electronic system including a memory device, in accordance with an embodiment of the present invention.

As shown in FIG. 8, an electronic system 260 includes an input device 262, an output device 264, a processor device 266, and a memory device 268 that incorporate the memory device 100 as described with respect to one or more embodiments of the present invention. Also, it should be noted that the memory device 100 may be incorporated into any one of the input, output, and processor devices 262, 264, and 266.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of repairing memory cells, comprising:
nonvolatilely programming a group of programmable elements on a memory device to store a first address designating a first defective memory cell in a first array of memory cells, wherein the nonvolatilely programming includes programming antifuses to store the first address designating the first defective memory cell;
serially forwarding the first address to a first volatile cache of the memory device; and
substituting a first redundant memory cell for the first defective memory cell when a memory access corresponds to the first address.

2. The method of claim 1, wherein serially forwarding the first address further includes serially forwarding the first address to a first volatile cache more proximately located to the first redundant memory cell than to the group of programmable elements.

3. A method of repairing memory cells, comprising:
nonvolatilely programming a memory device, a group of programmable elements to store a first address designating a first defective memory cell in a first array of memory cells;
serially forwarding the first address to a first volatile cache of the memory device; and
substituting a first redundant memory cell for the first defective memory cell when a memory access corresponds to the first address;
nonvolatilely centrally programming, on the memory device, the group of programmable elements to store a second address designating a second defective memory cell in a second array of memory cells;
serially forwarding the second address to a second volatile cache of the memory device; and
substituting a second redundant memory cell for the second defective memory cell when a memory access corresponds to the second address.

4. The method of claim 3, wherein serially forwarding the first and second addresses compromises storing the first and second addresses in respective vicinity to the first and second array of memory cells.

5. The method of claim 3, further comprising spatially volatilely storing the first and second addresses.

6. The method of claim 3, wherein volatilely storing the first address occurs during startup of the memory device.

7. A method of repairing memory cells, comprising:
nonvolatilely programming, on a memory device, a group of programmable elements to store an address designating a defective memory cell in an array of memory cells; and
volatilely storing a cached address corresponding to the address that designates the defective memory cell, the cached address being more proximately located to one of the defective memory cell or a redundant memory cell than to the group of programmable elements.

8. The method of claim 7, wherein volatilely storing a cached address includes distributing the address designating the defective memory cell to a volatile cache on the memory device.

9. The method of claim 8, wherein distributing the address further includes serially forwarding the address to the volatile cache.

10. A method of repairing memory cells, comprising:
on a memory device, nonvolatilely programming and volatilely storing in vicinity to an array of memory cells that includes a defective memory cell a cached address designating the defective memory cell on the memory device; and
substituting a redundant memory cell for the defective memory cell when a memory access corresponds to the cached address.

11. The method of claim 10, wherein the nonvolatilely programming includes programming antifuses to store the cached address designating the defective memory cell.

12. The method of claim 10, wherein volatilely storing the cached address includes distributing the cached address designating the defective memory cell to a volatile cache on the memory device.

13. A memory device comprising:
antifuses;
programming logic configured to nonvolatilely program the antifuses in response to program data, wherein the program data corresponds to a first defective memory cell in a first array of memory cells;
first logic configured to nonvolatilely store a first address designating the first defective memory cell and distribute the first address to a first volatile cache; and
second logic configured to nonvolatilely store a second address designating a second defective memory cell in a second array of memory cells, the second logic further configured to distribute the second address designating the second defective memory cell to a second volatile cache on the memory device, wherein the first and second logics are centrally arranged and the first and second addresses are spatially distributed to the first and second volatile caches.

14. The memory device of claim 13, wherein the antifuses are further configured to distribute the first address to the first volatile cache during startup of the memory device.

15. A memory device comprising:
a memory cell array and a redundant cell array;
a volatile cache;
a repair circuit configured to:
nonvolatilely store an address designating a defective memory cell in the memory cell array; and
serially distribute the address to the volatile cache, wherein the volatile cache stores a cached address corresponding to the address that designates the defective memory cell; and match circuitry configured to substitute a memory cell from the redundant cell array for the defective memory cell when a memory access corresponds to the cached address.

16. The memory device of claim 15, wherein the repair circuit includes a parallel-to-serial circuit configured to serially distribute the address to the volatile cache.

* * * * *